(12) United States Patent
Zeng et al.

(10) Patent No.: US 7,480,986 B2
(45) Date of Patent: Jan. 27, 2009

(54) APPARATUS FOR FEEDING COMPONENTS FROM PACKAGED COMPONENT BAND

(75) Inventors: Zhao-Lue Zeng, Shenzhen (CN);
Hsuan-Jen Kung, Tu-cheng (TW);
Yuan-Chiu Lin, Tu-cheng (TW)

(73) Assignees: Hong Fu Jin Precision Industry (Shenzhen) Co., Ltd., Bao-an District, Shenzhen, Quangdong Province (CN);
Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 308 days.

(21) Appl. No.: 11/367,095

(22) Filed: Mar. 3, 2006

(65) Prior Publication Data

US 2006/0196044 A1    Sep. 7, 2006

(30) Foreign Application Priority Data

Mar. 4, 2005    (CN) .................... 2005 2 0055502 U
Dec. 3, 2005    (CN) .................... 2005 2 0145515 U

(51) Int. Cl.
*H05K 3/30*    (2006.01)
(52) U.S. Cl. ............................. 29/740; 29/705; 29/739; 29/834; 29/426.3; 414/811
(58) Field of Classification Search ............... 29/705, 29/740, 743, 720–721, 407, 832–834, 426.3–426.7, 29/430; 226/5, 8, 115, 151, 157; 414/810–811, 414/416.01, 403; 221/25
See application file for complete search history.

(56) References Cited

U.S. PATENT DOCUMENTS

| | | | | |
|---|---|---|---|---|
| 4,438,559 | A * | 3/1984 | Asai et al. | 29/740 |
| 5,289,625 | A * | 3/1994 | Umetsu et al. | 29/426.3 |
| 5,713,125 | A * | 2/1998 | Watanabe et al. | 29/833 |
| 6,094,808 | A * | 8/2000 | Mimura et al. | 29/743 |
| 6,923,878 | B2 * | 8/2005 | Davis et al. | 156/64 |
| 7,096,571 | B2 * | 8/2006 | Bergstrom | 29/739 |

FOREIGN PATENT DOCUMENTS

JP    9-64586    3/1997

\* cited by examiner

*Primary Examiner*—Minh Trinh
(74) *Attorney, Agent, or Firm*—Morris Manning Martin LLP; Tim Tingkang Xia, Esq.

(57) ABSTRACT

An apparatus for feeding components from a packaged component band includes a stand defining a platform allowing the packaged component band passing therealong, a first guiding unit installable to the stand beside the platform, and a second guiding unit installable to the stand next to the another end of the platform. The first guiding unit is urged to remove a package from the packaged component band to expose components at one end of the platform and guides the package toward another end of the platform. The second guiding unit accepts the package from the first guiding unit and accelerates movement of the package passing therethrough. The second guiding unit includes a first friction pulley urged to rotate, and a second friction pulley rotatably movable together with the first friction pulley and engagable with the package when the package engagably passes therethrough.

9 Claims, 11 Drawing Sheets

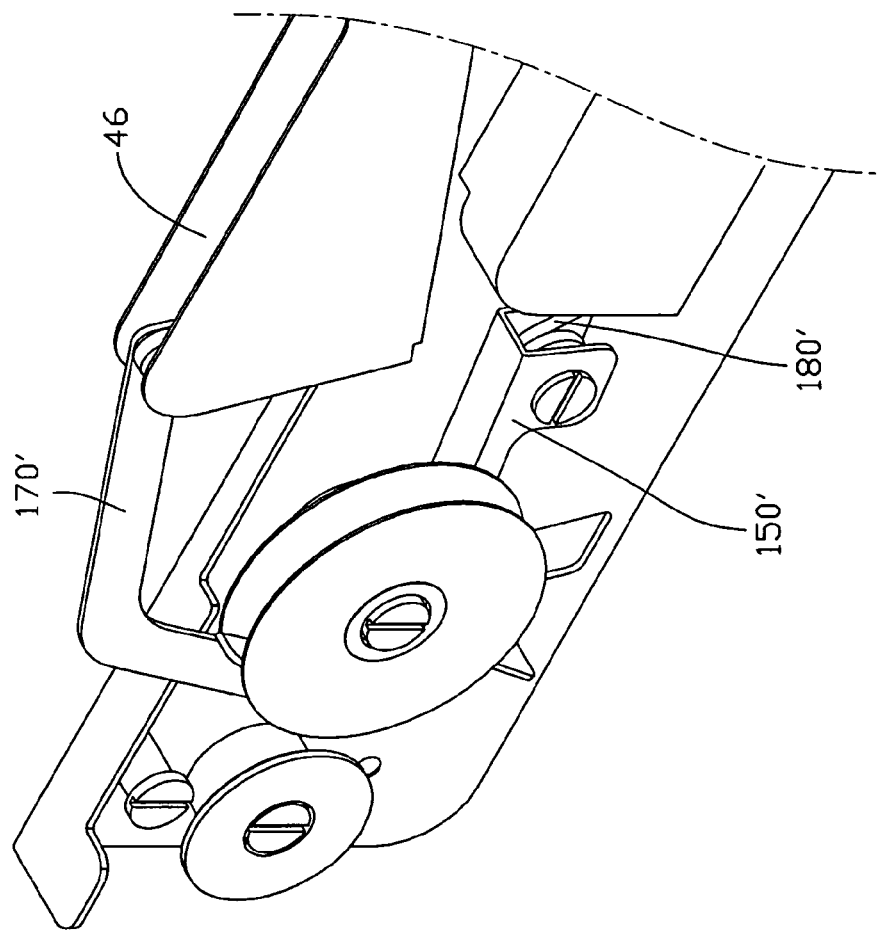

APPARATUS FOR FEEDING COMPONENTS FROM PACKAGED COMPONENT BAND

CROSS-REFERENCE TO RELATED APPLICATIONS

Relevant subject matter is disclosed in a co-pending U.S. patent application entitled "PACKAGE REMOVAL DEVICE", filed on Dec. 21, 2005 with application Ser. No. 11/316,009, and assigned to the same assignee with this application.

BACKGROUND

1. Field of the Invention

The present invention relates to removal devices, and particularly to a removal device which can efficiently remove a package that is stripped from a component band.

2. General Background

Conventionally, there are a lot of electronic components arranged on a circuit board to form a circuit with a certain function, such as capacitors, resistors, and inductors. As showing in FIG. 1, a component band 1 fixed with above-mentioned electronic components is often used during the assembly of the circuit board. The component band 1 includes a carrier band 2, and a package 5 attached on the carrier band 2. The carrier band 1 defines a lot of dents 3, and a lot of apertures 6 therein. Each dent 3 accommodates with an electronic component 4 therein. The package 5 is configured to prevent the components 4 from damaging. Before assembly, the package 5 must be removed by some tools to expose the components 4 on the carrier band 2 for easily being picked up. Japan Patent No. 9-64586 discloses a package removal device. The package removal device includes a conveyor band, and a collecting wheel. The component band moves through the package removal device, and the package winds around the collecting reel to be stripped from the component band. However, when many of the packages wind around the collected reel, the machine must stop to take down the collecting wheel for cleaning the packages. This is inconvenient and costly during the whole assembly process.

What is desired, therefore, is a package removal device which can efficiently remove a package that is stripped from a component band.

SUMMARY

An exemplary package removal device for removing a package that is stripped from a component band includes a first guiding unit and a second guiding unit. The first guiding unit transports the package stripped from the component band. The second guiding unit further removes the package that is removed from the first guiding unit. The second guiding unit includes a first friction pulley rotating via the moving of the component band, and a second friction pulley mounted to and rotating together with the first friction pulley. The second friction pulley removes the package.

Other advantage and novel feature will become more apparent from the following detailed description when taken in conjunction with the accompanying drawings, in which:

BRIEF DESCRIPTION OF THE DRAWINGS

FIG. 11 is an assembled view of FIG. 9.

DETAILED DESCRIPTION OF THE EMBODIMENTS

Figure 1:
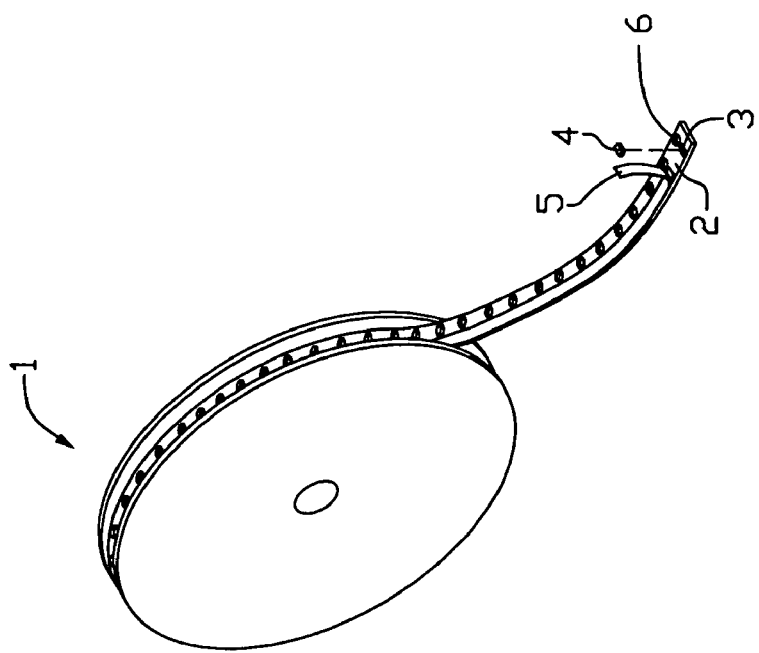
FIG. 1 is an isometric view of a component band.
Figure 2:
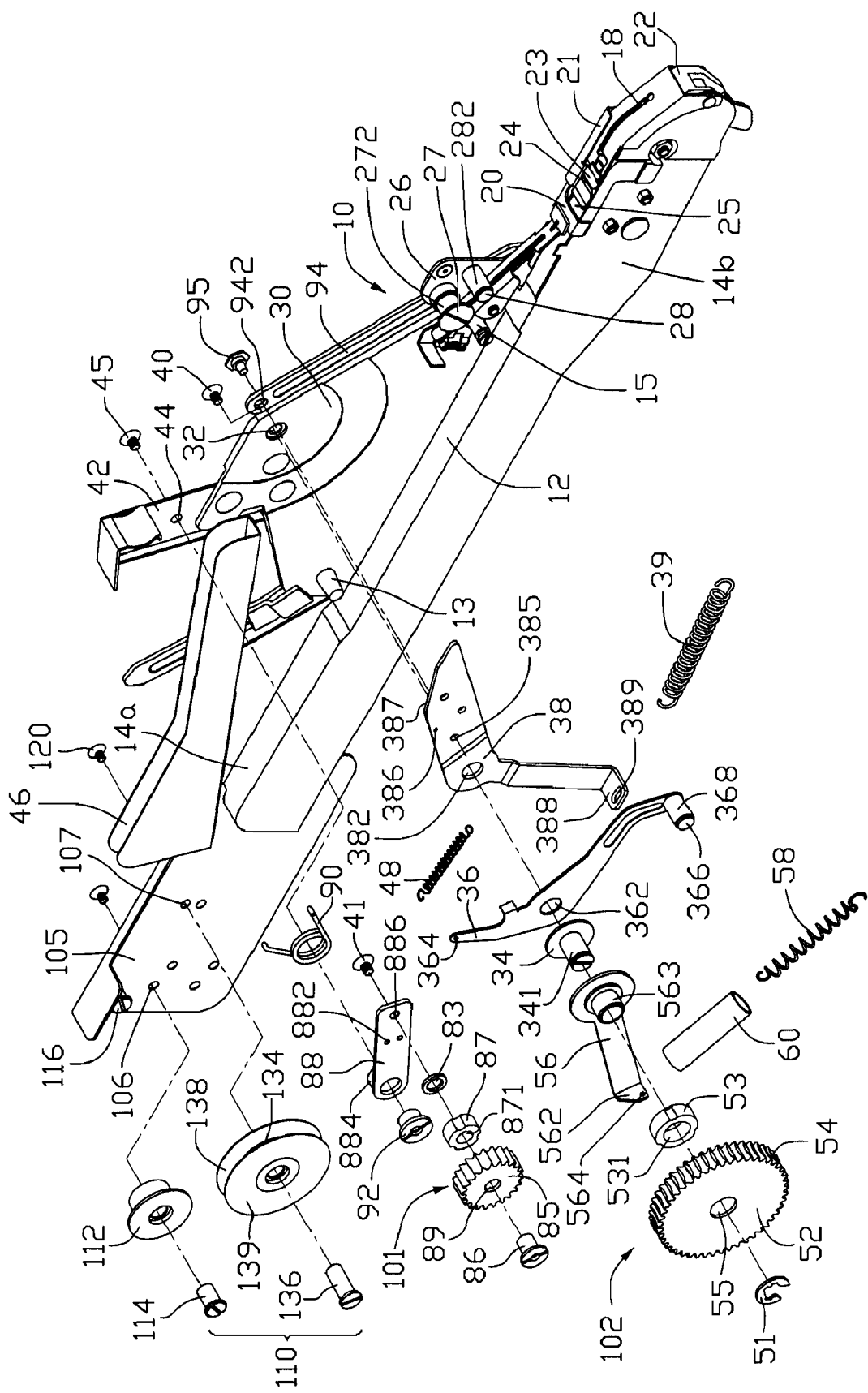
FIG. 2 is an exploded, isometric view of a package removal device in accordance with a preferred embodiment of the present invention, the package removal device includes a first guiding unit and a second guiding unit.
Figure 3:
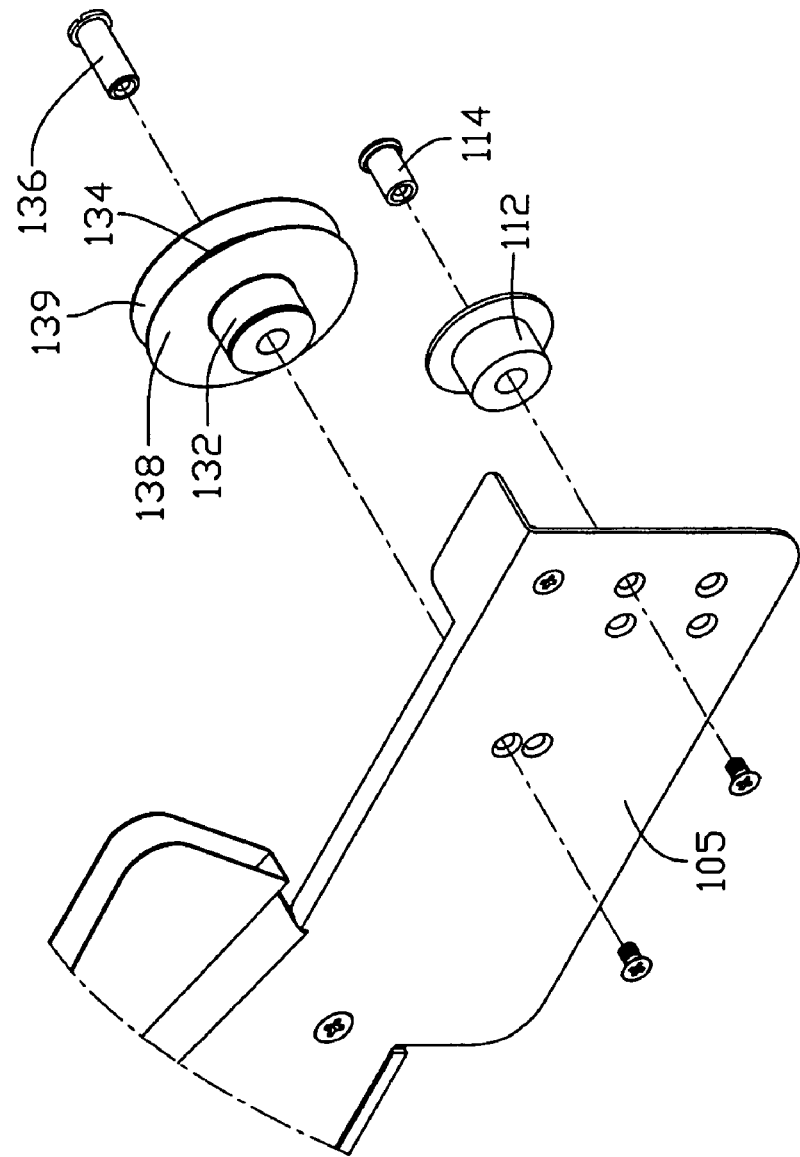
FIG. 3 is an exploded, isometric view of the second guiding unit of FIG. 2, but viewed from another aspect.

Referring to FIGS. 1 to 3, a package removal device of an apparatus to feed components for further processing in accordance with a preferred embodiment of the present invention is shown for removing a package 5 that is stripped from a component band 1 to expose electronic components 4 thereon. The package removal device includes a stand 10, a first guiding unit 100 and a second guiding unit 110. The first guiding unit 100 includes a first scrolling unit 101, a second scrolling unit 102, and a U-shaped ditch 46 providing a transport passage for the package 5.

The stand 10 includes a platform 12, a main mounting board 30 extending upwardly from an edge of the platform 12, a first mounting board 42 mounted to the main mounting board 30, a second mounting board 26 parallel to the main mounting board 30, and a crank bar 94. The ditch 46 is slantingly disposed between the platform 12 and the main mounting board 30.

Figure 4:
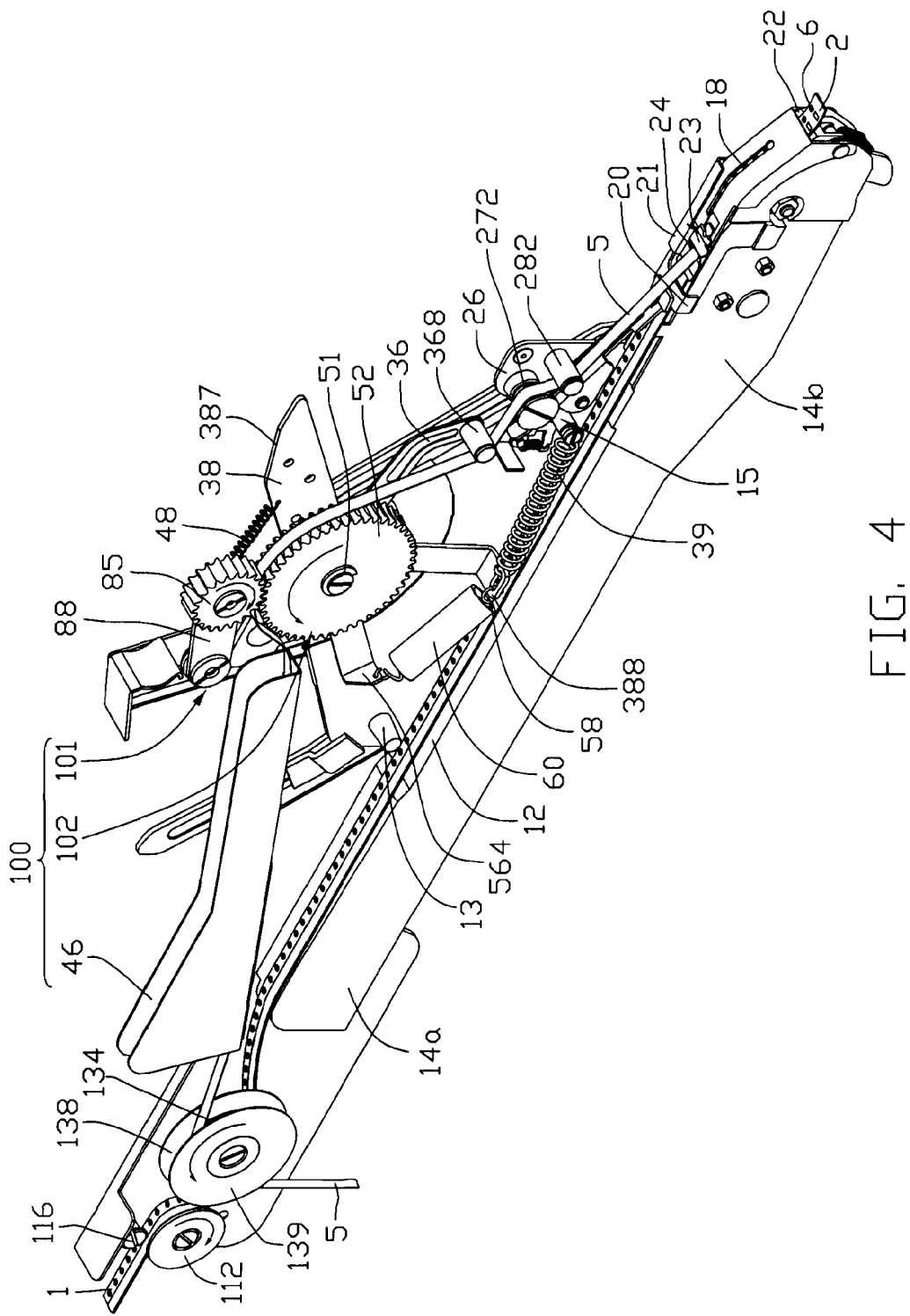
FIG. 4 is an assembled view of FIG. 2.
Figure 5:
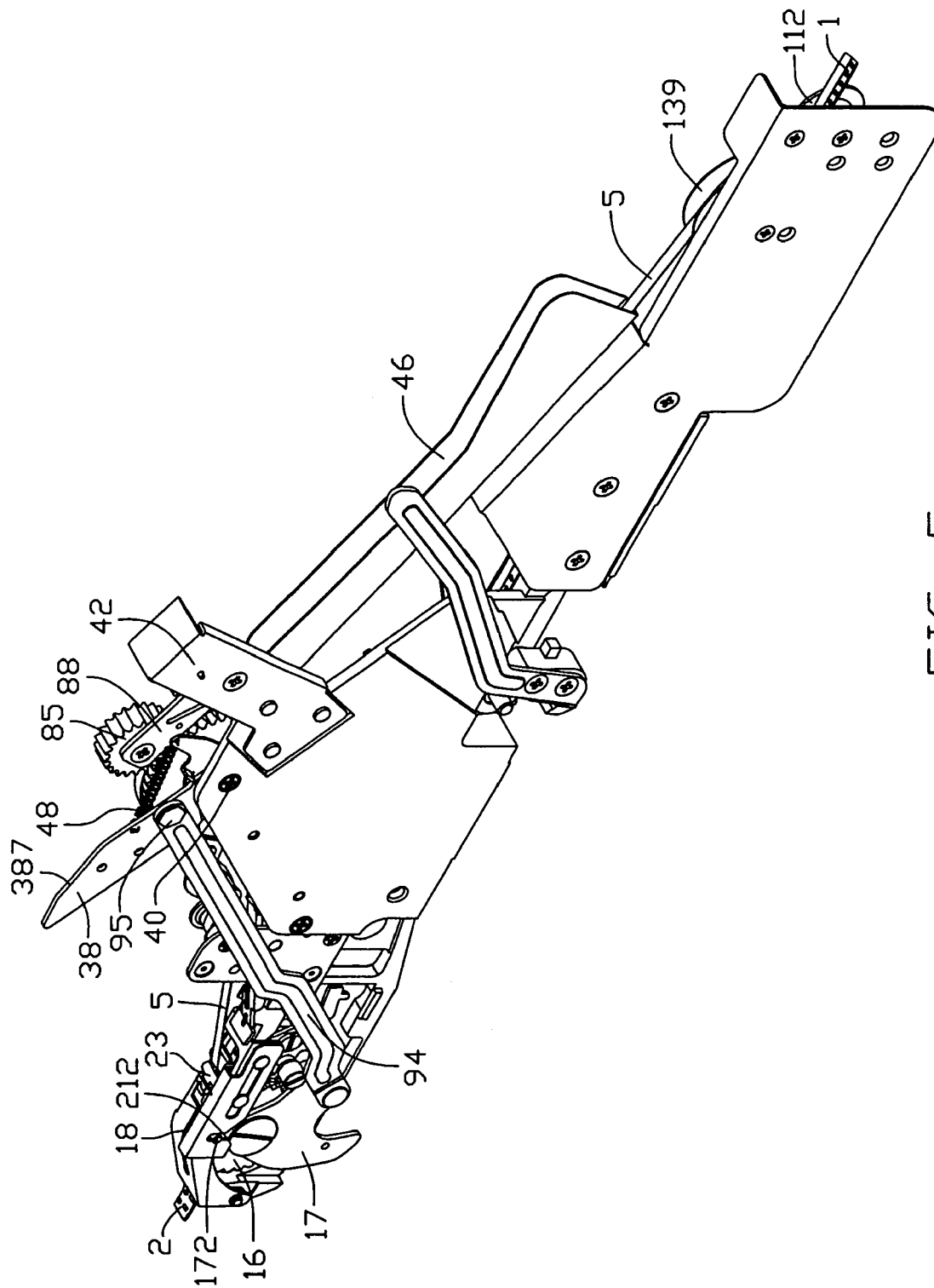
FIG. 5 is similar to FIG. 4, but viewed from another aspect.

The platform 12 includes an import end 14a, and an export end 14b. The export end 14b has a shell configuration. Referring also to FIGS. 4 and 5, the export end 14b includes a one-way ratchet 16, a locating gear 18 installed therein, a bridge 20 mounted to the platform 12, and a slider 21 slidably attached thereon. The ratchet 16 includes a leaf 17. A pin 172 extends perpendicularly from the leaf 17. The slider 21 is slidably mounted to the platform 12 and defines a channel 212 therein for engaging with the pin 172. A cutout 25 is defined in the bridge 20. The slider 21 includes a package export 24 and a blade 23 on a top portion of the platform 12 extending into the package export 24. A carrier band export 22 is defined in a distal portion of the export end 14b between the platform 12 and the bridge 20. The locating gear 18 is for engaging in apertures 6 of the carrier band 2. The crank bar 94 includes a first end pivotably fixed on the leaf 17, and a second end defining a through hole 942 therein for engaging with a screw 95.

Figure 8:
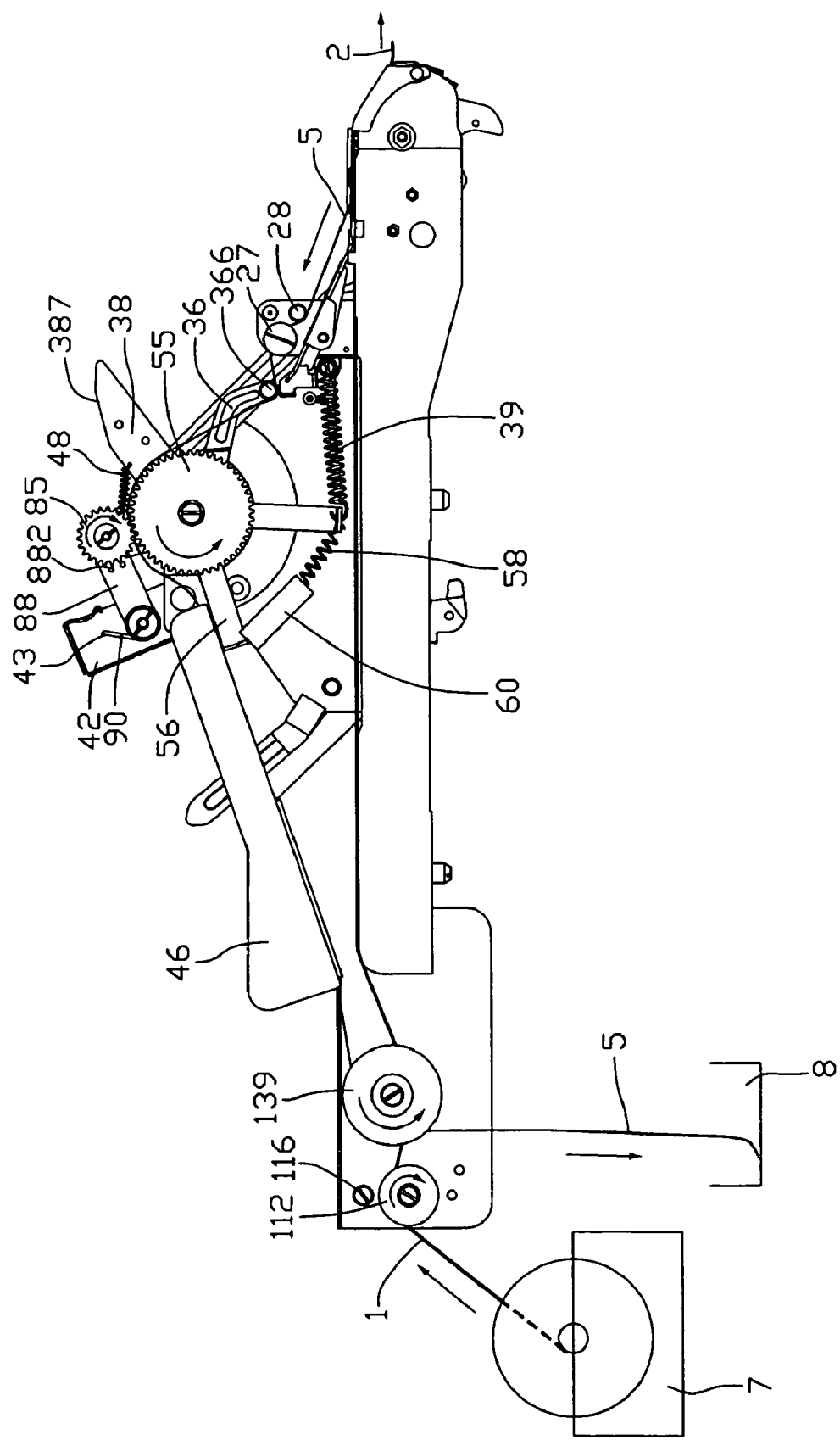
FIG. 8 is a schematic view showing a working principle of the package removal device of FIG. 2.

The main mounting board 30 includes a post 13, and a rod 15 extending perpendicularly therefrom. The second mounting board 26 includes a spindle 27 and a pole 28 extending perpendicularly therefrom. Rollers 272, 282 are rotatably mounted to the spindle 27 and pole 28. The main mounting board 30 defines a first mounting hole 32 therein. Referring also to FIG. 8, the first mounting board 42 defines an aperture 43, and a second mounting hole 44 therein.

The first scrolling unit 101 of a driving mechanism for the package 5 includes a first gear 52, a first one-way bearing 53, a swing plate 56, a pressing plate 36, a spring washer 51, a mounting member 34 defining a threaded hole therein, a lever 38, a bushing 60, three resilient members 39, 48, 58, and a screw 40. A grading hole 55 is defined in a central portion of the first gear 52. A through hole 531 is defined in the one-way bearing 53, corresponding to the grading hole 55. The swing plate 56 includes a hollow sleeve 563 extending from an end thereof, and a flange 562 extending perpendicularly from the opposite end thereof. An aperture 564 is defined in the flange 562. The pressing plate 36 includes a central hole 362 defined in a middle portion thereof, a mounting pole 366 extending from an end portion thereof with a roller 368 rotatably mounted thereto, and an aperture 364 defined in another opposite end portion thereof. A mounting post 341 extends from the mounting member 34. The lever 38 includes a central hole 382 defined in a general central portion thereof, a tab 388 defining a slot 389 extending perpendicularly from a bottom end thereof, a through hole 385 and an aperture 386 defined therein adjacent the central hole 382 in an upper portion thereof. A contact side 387 is formed at a top edge portion of the lever 38.

The second scrolling unit 102 of the driving mechanism includes a second gear 85, a second one-way bearing 87, an urging plate 88, a first stud 86 defining a threaded hole therein, a second stud 92 defining a threaded hole therein, a torsion spring 90, a gasket 83 defining a through hole therein, and a pair of screws 41, 45. A grading hole 89 is defined in a central portion of the second gear 85. A through hole 871 is defined in the second one-way bearing 87. The urging plate 88 includes a hollow sleeve 884 extending from an end thereof, and an aperture 882 and a through hole 886 defined therein.

The second guiding unit 110 further removing the package 5 that is removed from the first guiding unit 100 includes a mounting plate 105 extending from the import end 14a of the platform 12, a lifting member mounted to a distal end of the mounting plate 105 for lifting the component band 1, and a pull member mounted to the mounting plate 105 between the import end 14a of the platform 12 and the lifting member for removing the package 5 that is removed from the first guiding unit 100. A limiting pole 116 protrudes from the distal end of the mounting plate 105, corresponding to the lifting member.

The lifting member includes a hollow lifting roller 112, a first shaft 114 defining a threaded hole therein, and a first fixing hole 106 defined in the mounting plate 105.

The pull member includes a first friction pulley 132 defining a through hole in a center portion thereof, a second friction pulley 134 mounted to the first friction pulley 132 defining a through hole communicating with the through hole of the first friction pulley 132, a second shaft 136, and a second fixing hole 107 defined in the mounting plate 105. A diameter of the second friction pulley 134 is larger than that of the first friction pulley 132. Silica-gel rings having large friction coefficient can ring the first friction pulley 132 and the second friction pulley 134. A first separator 138 is fixed between the first friction pulley 132 and the second friction pulley 134. A Second separator 139 is fixed to an outer surface of the second friction pulley 134.

Referring to FIGS. 1 to 8, the first guiding unit 100, and the second guiding unit 110 are separately assembled to the stand 10.

The screw 40 is extended through the first mounting hole 32 of the main mounting board 30, the central hole 382 of the lever 38, the central hole 362 of the pressing plate 36 in turn to engage in the threaded hole of the mounting member 34. The mounting post 341 of the mounting member 34 is extended through the hollow sleeve 563 of the swing plate 56, the through hole 531 of the first one-way bearing 53, the grading hole 55 of the first gear 52 to engage with the spring washer 51. The resilient member 58 is extended through the bushing 60. Two free ends of the resilient member 58 engage in the aperture 564 of the swing plate 56 and the slot 389 of the lever 38 respectively. Two free ends of the resilient member 48 engage in the aperture 364 of the pressing plate 36 and aperture 386 of the lever 38 respectively. Two free ends of the resilient member 39 engage in the slot 389 of the lever 38 and the rod 15 of the stand 10 respectively. The screw 95 is extended through the through hole 942 of the crank bar 94 to engage in the through hole 385 of the lever 38.

The second one-way bearing 87 engages in the grading hole 89 of the second gear 85. The screw 41 is extended through the through hole 886 of the urging plate 88, the gasket 83, and the through hole 871 of the second one-way bearing 87 to engage in the first stud 86. The second stud 92 engages in the hollow sleeve 884 of the urging plate 88. The screw 45 is extended through the second mounting hole 44 of the first mounting board 42, and the torsion spring 90 to engage in the second stud 92. Two free fingers of the torsion spring 90 are engaged in the aperture 882 of the urging bar 88 and the aperture 43 of the first mounting board 42, respectively.

The first shaft 114 engages in the hollow lifting roller 112. A screw is extended through the first fixing hole 106 of the mounting plate 105 to engage in the first shaft 114. The second shaft 136 engages in the second friction pulley 134 and the first friction pulley 132. A screw 120 is extended through the second fixing hole 107 of the mounting plate 105 to engage in the second shaft 136.

In work, the component band 1 received in a first container 7 is fed into the package removal device through the limiting pole 116 and the lifting roller 112. The component band 1 moves on a lower circumference of the first friction pulley 132 to compel the first and second friction pulleys 132, 134 to rotate together. The component band 1 creeps below the post 13 and along the platform 12 to the export end 14b. The component band 1 moves below the bridge 20 and is divided into the package 5 and the carrier band 2. The carrier band 2 moves on and passes through the carrier band export 22, with the apertures 6 engaging with teeth of the locating gear 18. The package 5 is stripped from the component band 1 by the blade 23 and is propelled in a different direction with the carrier band 2 out of the package export 24. The package 5 moves along a lower circumference of the roller 282 of the pole 28, an upper circumference of the roller 272 of the spindle 27, and a lower circumference of the roller 368 of the pressing plate 36 to climb to the first gear 52. The second gear 85 is pushed away from the first gear 52, and the torsion spring 90 is twisted. When the package 5 moves on a top circumference of the first gear 52, the second gear 85 is released to mesh with the first gear 52. The package 5 moves between the first gear 52 and the second gear 85, and further moves into the ditch 46. The package S transported from the ditch 46 is removed from the second guiding unit 110, and still further moves into a second container 8.

Figure 6:
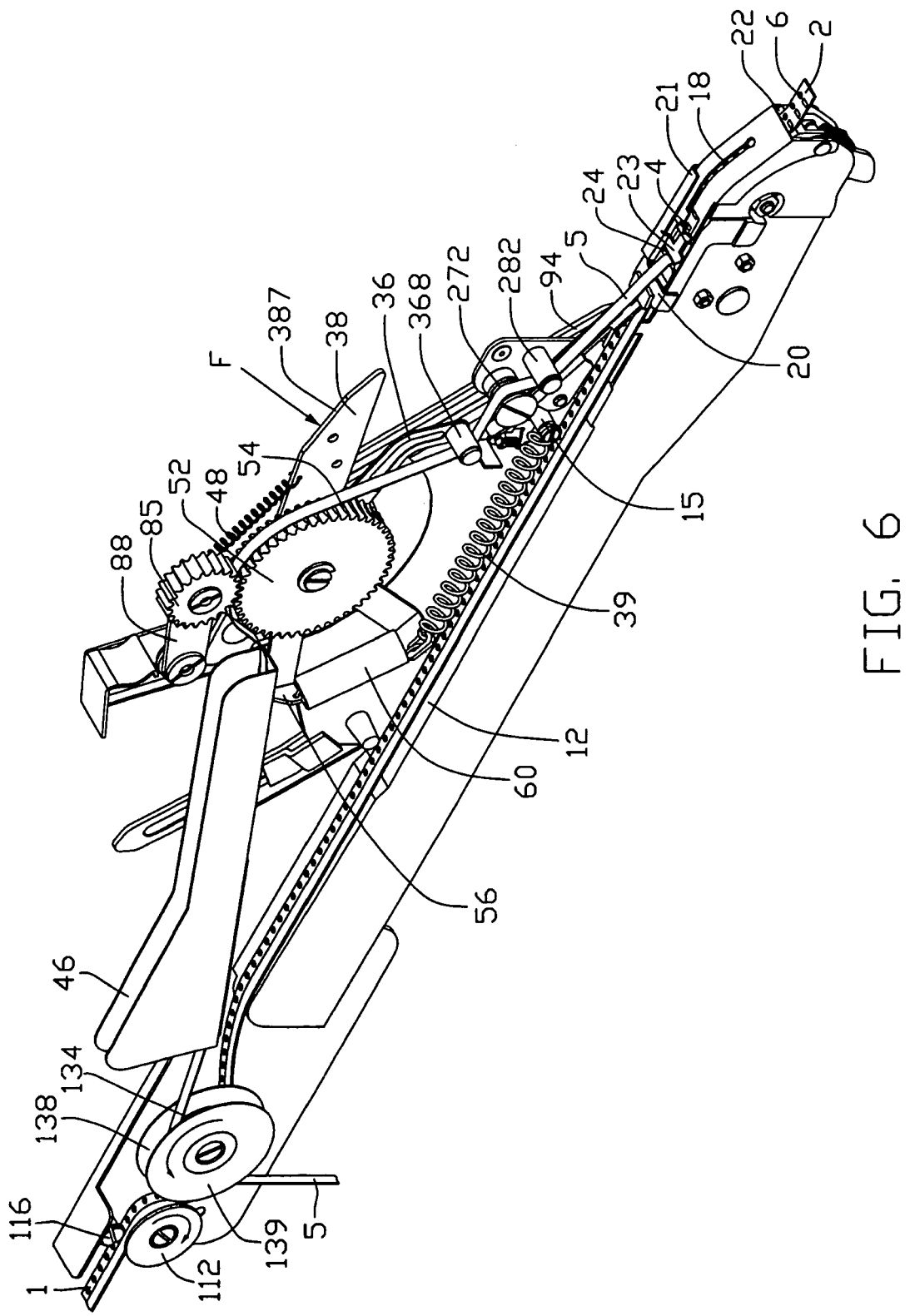
FIG. 6 is an assembled view of FIG. 2, showing a force applied on the package removal device.
Figure 7:
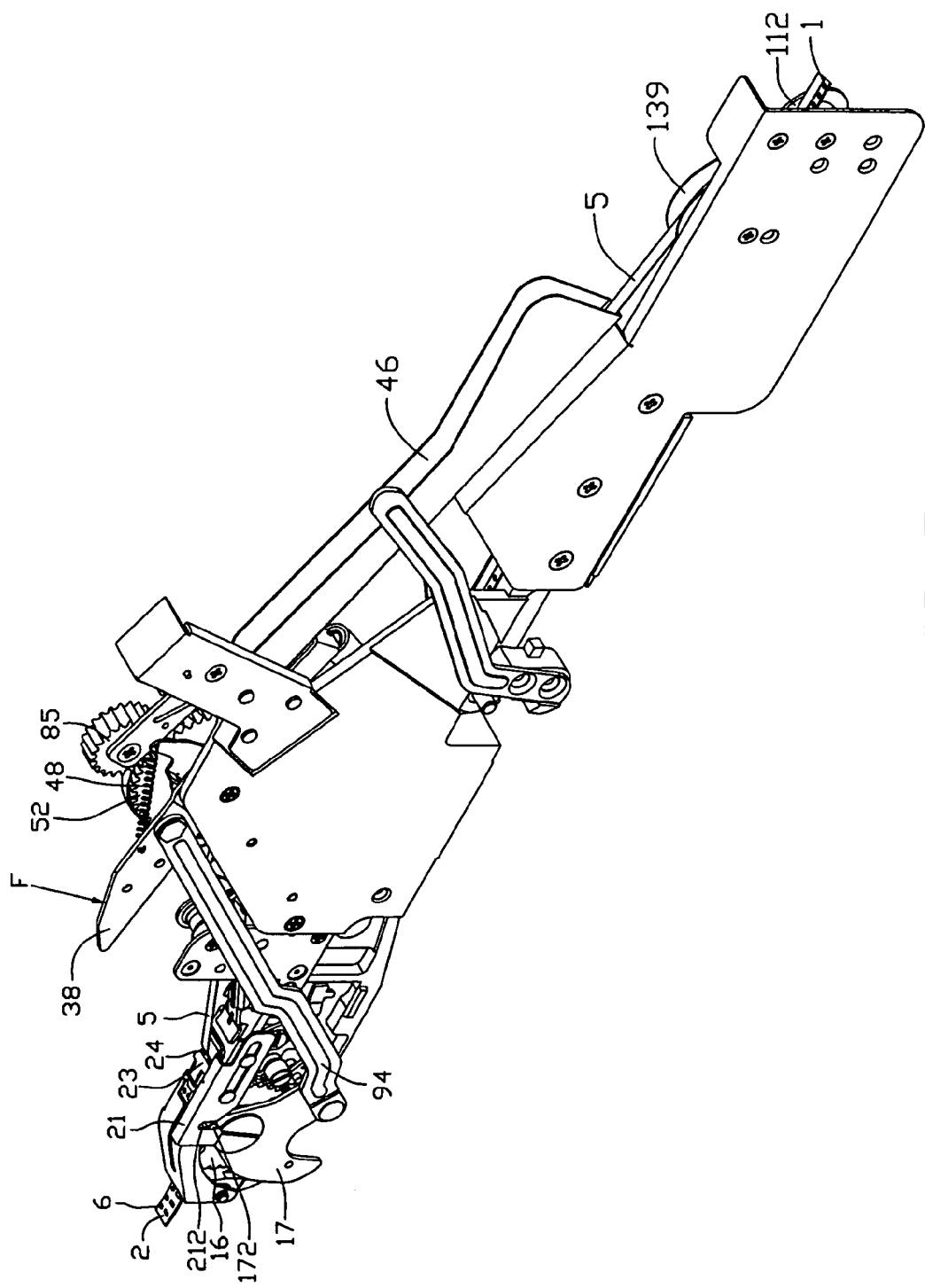
FIG. 7 is similar to FIG. 6, but viewed from another aspect.

Referring also to FIGS. 6 and 7 , a force is applied to the contact side 387 of the lever 38 to rotate the lever 38 clockwise. The pressing plate 36, the bushing 60, and the swing plate 56 are accordingly rotated clockwise. The lever 38 stretches the resilient member 48. The crank bar 94 is accordingly moved to rotate the leaf 17. The slider 21 moves away from the carrier band export 22, with the pin 172 of the leaf 17 sliding in the channel 212 of the slider 21. The one-way ratchet 16, the component band 1, the first gear 52, the second gear 85 are keep still. The blade 23 of the slider 21 strips the package 5 from the component band 1. The roller 368 of the pressing plate 36 accordingly stretches the package 5. Thus, the electronic components 4 of the component band 1 are exposed on the carrier band 2.

Referring also to FIGS. 4, 5 and 8, when the force is released, the resilient members 39, 48 are restored to move the lever 38 back, the resilient member 48 is restored to move the pressing plate 36 back, and the resilient member 58 is restored to move the swing plate 56 back. Accordingly, the first gear 52 rotates anticlockwise to mesh with the second gear 85. The locating gear 18 rotates clockwise to drive the carrier band 2 passes through the carrier band export 22. The first and second friction pulleys 132, 134 rotate anticlockwise together via the component band 1. The package 5 moves along the ditch 46 via the first gear 52 and the second gear 85. The package 5 moves on a top circumference of the second friction pulley 134, and falls into the second container 8. At the same time, the crank bar 94, the slider 21, and the leaf 17 move back to their respective original positions.

With the recycle of the above operations, the package 5 moves into the second container 8 from the import end 14a, and the carrier band 2 is attained out of the export end 14b in continuous. Without any stops, the package 5 is removed from the component band 1 during the work. The efficiency is increased.

Figure 9:
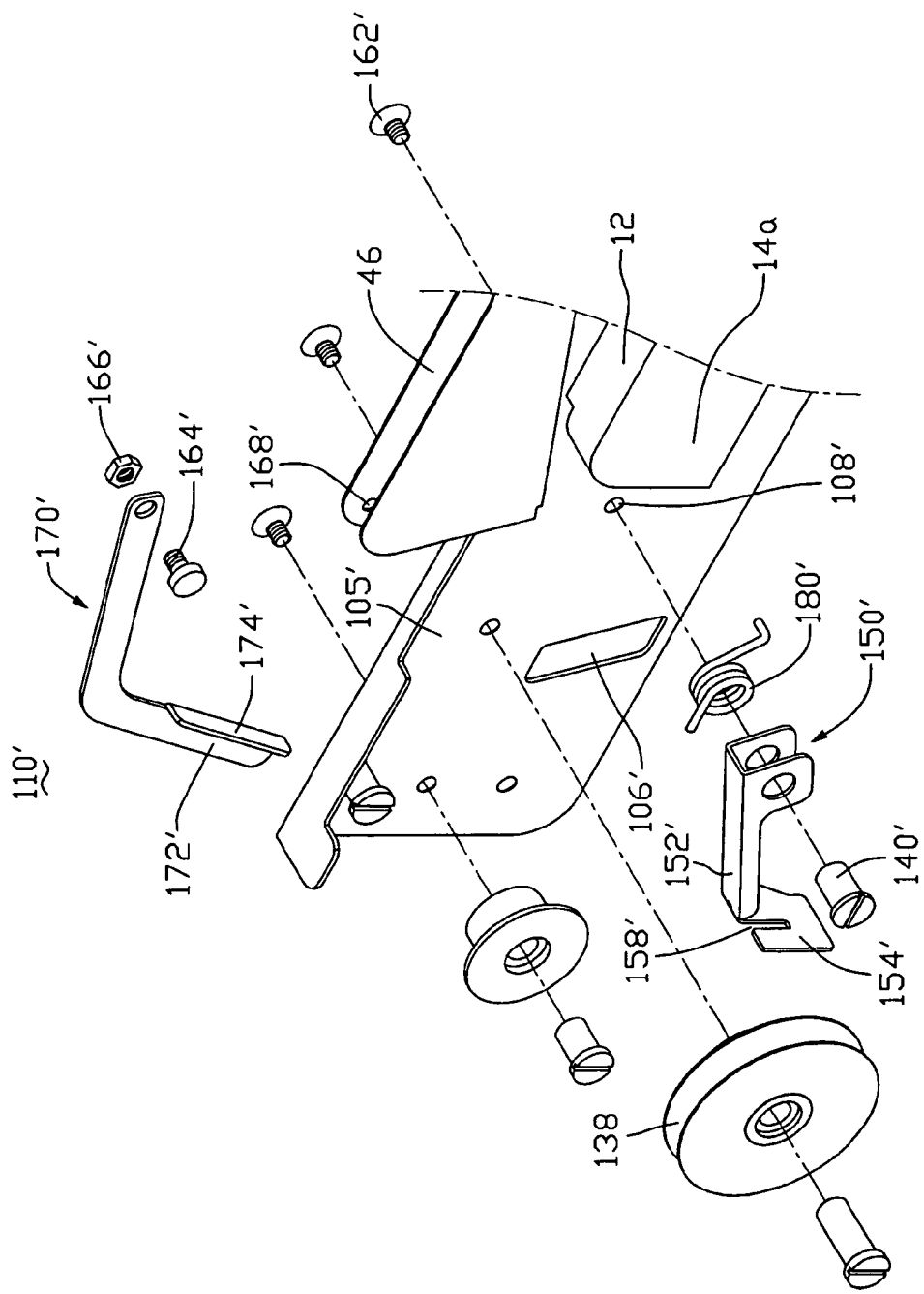
FIG. 9 is an exploded, isometric view of a second guiding unit of a package removal device in accordance with an alternative embodiment of the present invention, the second guiding unit includes a restriction member.
Figure 10:
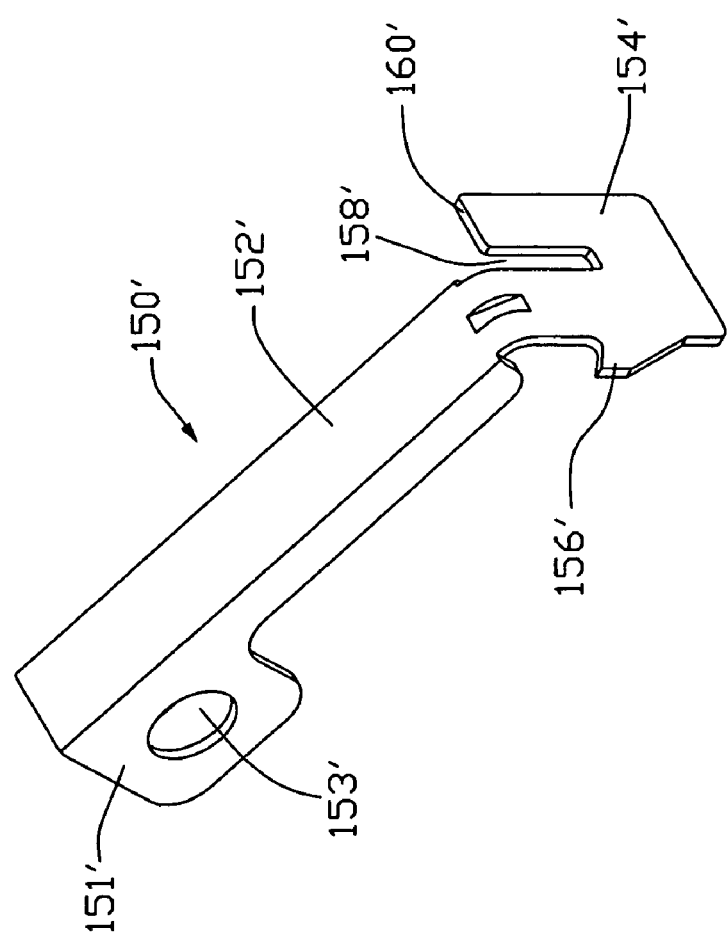
FIG. 10 is an isometric view of the restriction member of FIG. 9, but viewed from another aspect.

FIGS. 9-11 show a second guiding unit 110' in accordance with the alternative embodiment of the present invention. The second guiding unit 110' includes a mounting plate 105' extending from the import end 14aof the platform 12, a lifting member mounted to a distal end of the mounting plate 105', a pull member mounted to the mounting plate 105' between the import end 14a of the platform 12 and the lifting member. The lifting member and the pull member are similar to those of the above-mentioned embodiment. The second guiding unit 110' further includes a restriction member 150', a torsion spring 180', a limiting member 170', a third shaft 140', a bolt 164', and a nut 166'. The mounting plate 105' further defines an opening 106', a first securing hole 108, and an aperture (not shown) adjacent the securing hole 108' therein. A second securing hole 168' is defined in a distal end of one side panel of the ditch 46.

The restriction member 150' includes a body 152', a pair of mounting tabs 151' extending downwardly from opposite sides of one end of the body 152', and a location portion 154' extending downwardly from the other end of the body 152'. Two rotation holes 153' aligning with each other are defined in the mounting tabs 151'. A clasp 156' protrudes from a side of the location portion 154'. A cutout 158' is defined in a top portion of the location portion 154' with a shelter 160' being formed at an opposite side of the location portion 154'. The limiting member 170' includes an extension 172' extending downwardly from an end of the body 171', and a pressing portion 174' extending perpendicularly from a lower side of the extension 172'. A pivot hole 176' is defined in the other end of the body 171'.

In assembly, the third shaft 140' successively engages in the rotation holes 153' of the restriction member 150' and the torsion spring 180'. The screw 162' is extended through the first securing hole 108' of the mounting plate 150' to engage in the third shaft 140'. One end of the torsion spring 180' is engaged in the aperture of the mounting plate 105'. The other end of the torsion spring 180' is engaged with the body 152' of the restriction member 150'. The bolt 164' is extended through the pivot hole 176' of the restriction member 170' and the second securing hole 168' of the ditch 46 to engage with the nut 166'.

Before work, the clasp 156' of the restriction member 150' clasps a bottom side of the mounting plate 105'. After the component band 1 is put on a lower circumference of the first friction pulley 132, the clasp 156' is released from the bottom side of the mounting plate 105' to be received in the opening 106' of the mounting plate 105'. The body 152' and the lower circumference of the first friction pulley 132 tight press the component band 1 therebetween. The first separator 138 rotatably passes through the cutout 158' of the restriction member 150'. The shelter 160' is located at a lower portion of the second friction pulley 134. The pressing portion 174' presses the package 5 moving on the second friction pulley 134 to augment a force of friction between the package 5 and the second friction pulley 134. The shelter 160' can prevent the package moving from the second friction pulley 134 to move toward the platform 12.

The first gear 52 and the second gear 85 can be replaced by other elements, such as a pair of engaging wheels with enough frictions therebetween. Another unidirectional clutch member, such as a ratchet, also can respectively replace the first one-way bearing 53 and the second one-way bearing 87.

It is believed that the present embodiments and their advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. An apparatus for feeding components to be further processed from a packaged component band, comprising:
   a stand defining a platform to allow a packaged component band passing along said platform;
   a first guiding unit installable to said stand beside said platform, and capable of urging removal of a package from said packaged component band to expose components in said packaged component band at one end of said platform, and guiding said package toward another end of said platform; and
   a second guiding unit installable to said stand next to said another end of said platform, and capable of accepting said package from said first guiding unit and farther accelerating movement of said package passing therethrough by means of an accelerating way of said second guiding unit applicable on said packaged component band,
   wherein said second guiding unit comprising a first friction pulley urged to rotate via movement of said packaged component band when said packaged component band passes therethrough, and a second friction pulley rotatably movable together with said first friction pulley and engagable with said package when said package engagably passes therethrough.

2. The apparatus as claimed in claim 1, wherein a limiting member is installed beside said second guiding unit so as to urge abuttal of said package against said second guiding unit.

3. The apparatus as claimed in claim 1, wherein a diameter of said second friction pulley is larger than that of said first friction pulley.

4. The apparatus as claimed in claim 1, wherein two silica-gel rings having large friction coefficient ring said first friction pulley and said second friction pulley respectively.

5. The apparatus as claimed in claim 1, further comprising a mounting plate extending from said platform, with said first friction pulley being mounted thereto.

6. The apparatus as claimed in claim 5, wherein said second friction pulley is mounted to an outer surface of said first friction pulley.

7. The apparatus as claimed in claim 6, wherein a first separator is fixed between said first friction pulley and said second friction pulley.

8. The apparatus as claimed in claim 7, wherein a second separator is fixed to an outer surface of said second friction pulley.

9. The apparatus as claimed in claim 5, further comprising a restriction member rotatably mounted to said mounting plate via a torsion spring, said restriction member comprises a body urging abuttal of said packaged component band against said first friction pulley.

* * * * *